(12) United States Patent
Hasegawa

(10) Patent No.: US 6,381,142 B1
(45) Date of Patent: Apr. 30, 2002

(54) ELECTRONIC COMPONENT COMPRISING ELASTIC MEMBERS FOR FITTING THE COMPONENT TO BODY OF TARGET DEVICE

(75) Inventor: Takumi Hasegawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/421,887

(22) Filed: Oct. 21, 1999

(30) Foreign Application Priority Data

Oct. 22, 1998 (JP) .......................................... 10-301424

(51) Int. Cl.$^7$ ................................................ H05K 1/14
(52) U.S. Cl. ....................... 361/737; 361/802; 361/807; 211/41.17; 206/706; 439/76.1
(58) Field of Search ................................. 361/736, 737, 361/752–753, 801, 807, 808; 211/41.17; 206/706, 709; 220/4.02; 439/354, 344, 701, 76.1, 325, 328; 257/679

(56) References Cited

U.S. PATENT DOCUMENTS

| | | | | |
|---|---|---|---|---|
| 4,406,509 A | * | 9/1983 | Jagen ....................... 339/91 R |
| 4,572,602 A | * | 2/1986 | Rupnik ....................... 339/65 |
| 5,193,052 A | * | 3/1993 | Larson et al. ................ 361/395 |
| 5,541,448 A | * | 7/1996 | Carpenter ................... 257/679 |
| 5,689,137 A | * | 11/1997 | Weber ........................ 257/679 |
| 5,986,891 A | * | 11/1999 | Sugimoto ................... 361/737 |
| 5,995,373 A | * | 11/1999 | Nagai .......................... 361/755 |
| 6,075,709 A | * | 6/2000 | Yang ........................... 361/756 |
| 6,108,209 A | * | 8/2000 | Cox et al. ................... 361/737 |
| 6,178,096 B1 | * | 1/2001 | Flickinger et al. .......... 361/816 |

FOREIGN PATENT DOCUMENTS

| | | |
|---|---|---|
| JP | 64-21408 | 1/1989 |
| JP | 8-316664 | 11/1996 |

OTHER PUBLICATIONS

Japanese Utility Model Application No. 63–95296, published Jun. 20, 1988 with Summary.
Japanese Unexamined Patent Application No. 59–9998, published Jan. 19, 1984 with Summary.
Japanese Utility Model Application No. 4–72683, published Jun. 26, 1992 with Summary.

* cited by examiner

Primary Examiner—Jayprakash N. Gandhi
Assistant Examiner—Tuan Dinh
(74) Attorney, Agent, or Firm—Sughrue Mion, PLLC

(57) ABSTRACT

An electronic component is disclosed, which is easily attached to or detached from a target body, without using a holding mechanism at the body side. The electronic component has an electronic circuit and is provided in a body of a device. The electronic component comprises a main portion having a plate shape which enables this portion to be inserted into the body; and elastic members, provided at the top and bottom faces of the main portion, for pushing the main portion towards an inner face of the body when the main portion is inserted into the body, so as to fit the main portion in the body.

13 Claims, 2 Drawing Sheets

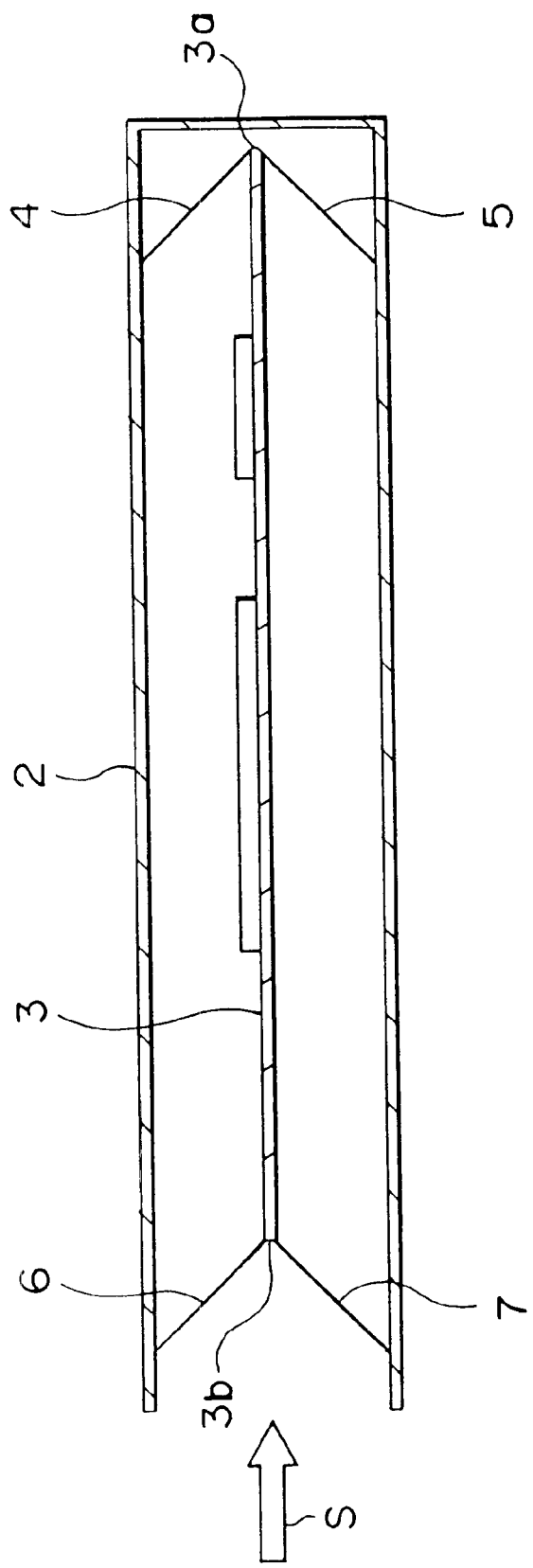

ELECTRONIC COMPONENT COMPRISING ELASTIC MEMBERS FOR FITTING THE COMPONENT TO BODY OF TARGET DEVICE

BACKGROUND OF THE INVENTION

1. Field of the Invention

The present invention relates to an electronic component such as a printed circuit board mounted onto a body of a thin-type computer or the like.

This application is based on Patent Application No. Hei 10-301424 filed in Japan, the contents of which are incorporated herein by reference.

2. Description of the Related Art

In conventional techniques, when a printed circuit board is mounted inside the (main) body of a thin-type computer or the like, the printed circuit board is attached to a portion of the body via screws, or a mechanism (such as guide rails) for holding the printed circuit board is necessary.

However, combining the printed circuit board and the body via screws is a time-consuming job including an attaching or detaching operation, and using a mechanism for holding the printed circuit board also requires a time-consuming job for providing such a mechanism in the body.

SUMMARY OF THE INVENTION

In consideration of the above circumstances, an objective of the present invention is to provide an electronic component, easily attached to or detached from a target body, without using a holding mechanism at the body side.

Therefore, the present invention provides an electronic component which has an electronic circuit and is provided in a body of a device, the electronic component comprising:
- a main portion having a plate shape which enables this portion to be inserted in the body; and
- elastic members, provided at the top and bottom faces of the main portion, for pushing the main portion towards an inner face of the body when the main portion is inserted into the body, so as to fit the main portion in the body.

According to this structure, the electronic component can be fit in the body (of a device) only by inserting the main portion (that is, by inserting the electronic component) into the body. Therefore, the attaching/detaching operation is very easy, and conventional time-consuming jobs such as combining the component with the body by using screws are unnecessary, thereby reducing the necessary processes. In addition, it is unnecessary to provide a mechanism (such as guide rails) for holding the electronic component in the body of a target device. Therefore, a flexible design and a compact body can be realized. Furthermore, the elastic members function as cushioning material with respect to vibrations or the like, thereby improving the impact or shock resistance of the electronic component.

In the above structure, the elastic members may be plate springs whose base ends are fixed to the main portion in a manner such that each plate spring extends slanting backwards with respect to the insertion direction of the main body. Accordingly, the main portion, that is, the electronic component, can be easily inserted and the inserted component is firmly fixed.

In a preferable arrangement, the elastic members are attached at least to a rear-side edge of the main portion with respect to the insertion direction of the main body, in a manner such that the elastic members cover an opening of the body when the main body is inserted from the opening in the body. Accordingly, the inside of the body cannot be observed from the outside; thus, it is unnecessary to provide a cover or the like at the opening of the body and necessary parts for the body of the device can be reduced.

BRIEF DESCRIPTION OF THE DRAWINGS

FIG. 2 is a general sectional view showing the state in which the printed circuit board of FIG. 1 is inserted into the target body.

DESCRIPTION OF THE PREFERRED EMBODIMENTS

Figure 1:
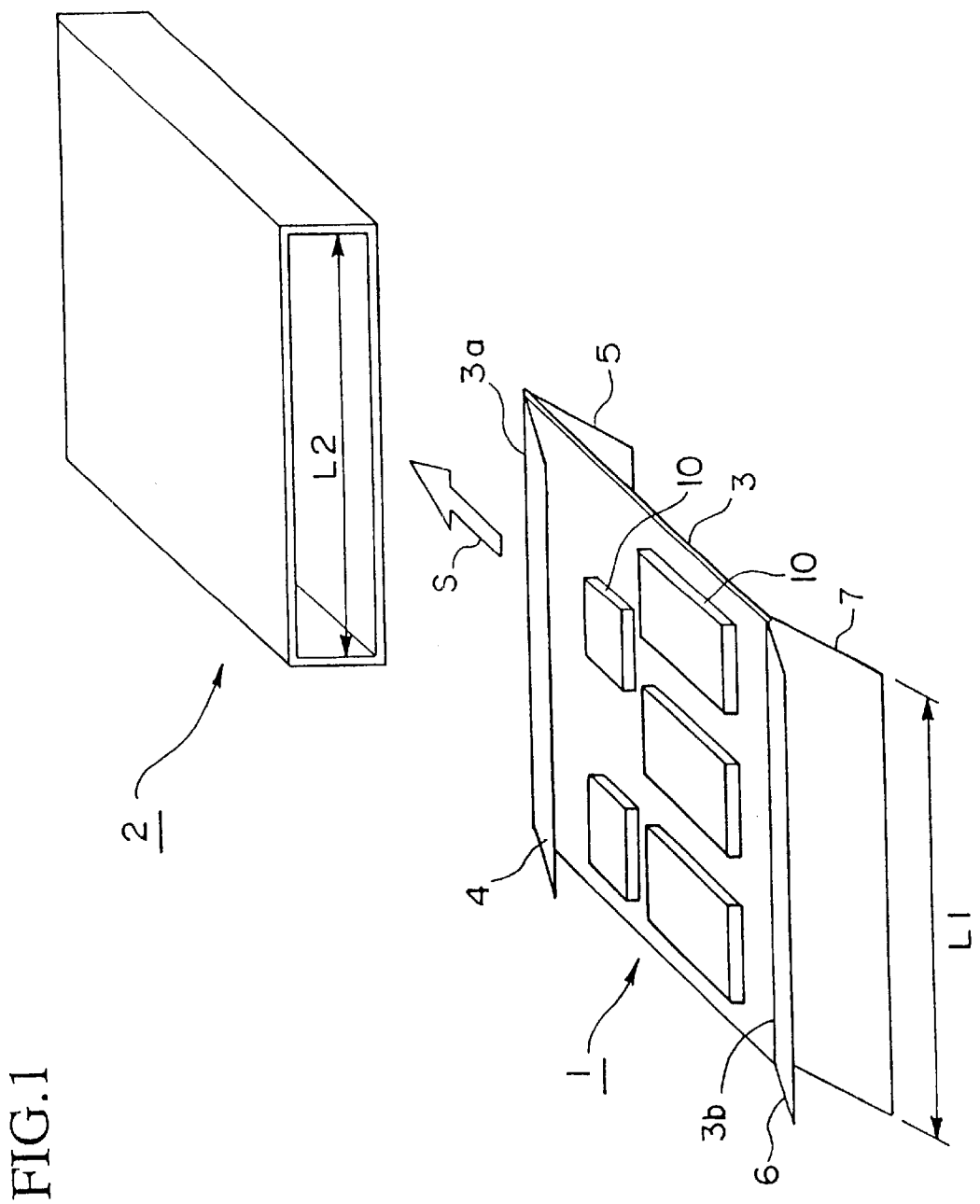
FIG. 1 is a perspective view showing an embodiment employing a printed circuit board as the electronic component according to the present invention.

Hereinafter, an embodiment of the electronic component according to the present invention will be explained with reference to FIGS. 1 and 2.

In these figures, reference numeral 1 indicates a printed circuit board, reference numeral 2 indicates a body into which the circuit board is inserted, reference numeral 3 indicates a substrate of the printed circuit board, and reference numerals 4 to 7 indicate plate (or blade) springs.

As shown in FIGS. 1 and 2, in this embodiment, the electronic component of the present invention is applied to a printed circuit board 1, and this board 1 comprises the substrate (i.e., the main portion of the electronic component, having a plate shape) 3 which can be inserted into body 2 of a thin type computer, and the plate springs (i.e., sheet metal) 4 to 7 which are attached to the top and bottom faces of substrate 3, and which push and fix the substrate 3 towards an inner face of the body 2 when the substrate is inserted into the body 2.

Printed wiring is formed on at least one of the top and bottom faces of the above substrate 3, and electronic elements 10 such as an LSI or IC are mounted on the top face of the substrate. In addition, a connector (not shown) for electronically connecting this board to an external device is provided at the rear-side edge 3b.

Here, a connector (or the like) may be provided in any area of the substrate 3 so as to electrically connect the board to an external device via a cable to be connected to the connector.

The base ends of the above plate springs 4 to 7 are fixed to the substrate 3 in a manner such that each plate spring extends slanting backwards with respect to the insertion direction S (see the figures).

That is, the plate springs 4 and 5 are respectively arranged at the top and bottom faces of the substrate 3 in a manner such that the base ends thereof are fixed to the front-side edge 3a of the substrate 3, and the section of this pair of plate springs 4 and 5 has a V-shape. Similarly, the plate springs 6 and 7 are respectively arranged at the top and bottom faces of the substrate 3 in a manner such that the base ends thereof are fixed to the rear-side edge 3b of the substrate 3, and the section of this pair of plate springs 6 and 7 also has a V-shape.

Here, width L1 (see FIG. 1) of the plate springs 4 to 7 is substantially the same as width L2 (along the width of the substrate 3) of the opening of body 2.

In order to provide the printed circuit board 1 in body 2, the printed circuit board 1 is inserted from the plate springs 4–5 side into the body 2 (as shown in FIG. 1), and the plate springs 4 to 7 are elastically deformed, and the generated elastic force pushes each plate spring against the inner wall of the body 2 (see FIG. 2). Therefore, the printed circuit board 1 is fitted and semi-fixed to the body 2. In addition, the substrate 3 is maintained in a non-contacting state with the inner walls of the body 2 via the plate springs 4 to 7, thereby preventing the printed wiring, LSI, and the like from directly contacting the body 2.

Generally, a cover or the like is further attached to the rear face (where an opening from which the printed circuit board is inserted) of the body of the computer, so as not to expose the inside of the body. However, in the present embodiment, the width L1 of the plate springs 6 and 7 is defined as the same length as the width L2 (along the substrate) of the opening of the body 2. Accordingly, when the printed circuit board 1 is inserted in the body 2, the opening of the body 2 is covered with the plate springs 6 and 7 so that the inside of the body 2 is not exposed. Therefore, in the present embodiment, it is unnecessary to provide a cover or the like in the body 2.

The present invention also includes the following embodiments:

(1) In the above embodiment, the present invention is applied to printed circuit board 1 as a plate-type electronic component; however, the present invention can be applied to other electronic components including electronic circuits, for example, an IC card.

(2) In the above embodiment, the electronic component is provided in the body of a thin-type computer; however, the electronic component of the present invention can be provided in the body of another electric device, for example, the body of a telephone (set), video tape recorder, CD or MD player, or the like. In addition, the electronic component of the present invention can be provided in the body of an inner device which is provided in the main body.

(3) In the above embodiment, the printed circuit board 1 is attached inside the body 2 via the plate springs 4 to 7; however, another elastic member may be used, which can push the board towards the inert faces of the body when the board is inserted. For example, a spring, sponge, or rubber may be used instead of a plate spring. In addition, different kinds of elastic members may be attached. For example, the plate springs 4 and 5 of the present embodiment may be still used, while plate springs 6 and 7 are replaced with sponge members.

(4) In the above embodiment, the plate springs 4 to 7 are attached to the front-side edge 3a and the rear-side edge 3b in the printed circuit board 1; however, these plate springs may be attached to any suitable parts. As explained above, in order to add the function of covering the opening of the body, to the printed circuit board, it is preferable to attach a portion of the plate spring to the rear-side edge 3b of the printed circuit board.

What is claimed is:

1. An electronic component which has an electronic element and is provided in a body of a device, the electronic component comprising:
   a main portion having a top and bottom face which forms a plate shape, which enables the main portion to be inserted into the body; and
   elastic members, respectively provided at the top and bottom faces of a rear of the main portion with respect to the insertion direction of the main portion such that the elastic members extend entirely at an edge in a slant and backward direction with respect to the insertion direction of the main portion, for pushing the main portion towards an inner face of the body when the main portion is inserted into the body, so as to fit the main portion in the body,
   wherein the electronic element is disposed on one of the faces of the main portion.

2. An electronic component as claimed in claim 1, wherein the elastic members are plate springs whose base ends are fixed to the main portion.

3. An electronic component as claimed in claim 1, wherein the elastic members are attached in a manner such that the elastic members cover an opening of the body when the main portion is inserted from the opening into the body.

4. An electronic component as claimed in claim 2, wherein the elastic members are attached in a manner such that the elastic members cover an opening of the body when the main portion is inserted from the opening into the body.

5. An electronic component as claimed in claim 2, wherein the base ends of the plate springs are fixed to a rear-side edge of the main portion.

6. An electronic component as claimed in claim 2, wherein additional plate springs are fixed to a front-side edge of the main portion.

7. An electronic component as claimed in claim 5, wherein additional plate springs are fixed to a front-side edge of the main portion.

8. An electronic component as claimed in claim 5, wherein the plate springs cover an opening of the body when the main portion is inserted from the opening into the body.

9. An electronic component which has an electric circuit and is provided in a body of a device, the body having an opening, the electronic component comprising:
   a main portion having a plate shape which enables this portion to be inserted into the body; and
   elastic members, provided at the top and bottom faces of the main portion, for pushing the main portion towards an inner face of the body when the main portion is inserted into the body, so as to fit the main portion in the body,
   wherein the elastic members are attached at least to a rear-side edge of the main portion with respect to the insertion direction of the main portion such that elastic members extend at an edge in a slant and backward direction with respect to the insertion direction of the main portion and, in a manner such that the elastic members substantially cover the entire opening of the body when the main portion is inserted from the opening into the body.

10. An electronic component which has an electric circuit and is provided in a body of a device, the body having an opening, the electronic component comprising:
   a main portion having a plate shape which enables this portion to be inserted into the body; and
   elastic members, provided at the top and bottom faces of the main portion, for pushing the main portion towards an inner face of the body when the main portion is inserted into the body, so as to fit the main portion in the body,
   wherein the elastic members are plate springs whose base ends are fixed to the main portion in a manner such that each plate spring extends in a slant and backward direction with respect to the insertion direction of the main portion, and
   wherein the elastic members are attached at least to a rear-side edge of the main portion with respect to the insertion direction of the main portion, in a manner such that the elastic members substantially cover the entire opening of the body when the main portion is inserted from the opening into the body.

11. An electronic component which has an electric circuit and is provided in a body of a device, the body having an opening, the electronic component comprising:

a main portion having a plate shape which enables this portion to be inserted into the body; and elastic members, provided at the top and bottom faces of the main portion, for pushing the main portion towards an inner face of the body when the main portion is inserted into the body, so as to fit the main portion in the body, wherein the elastic members are plate springs whose base ends are fixed to the main portion in a manner such that each plate spring extends in a slant and backward direction with respect to the insertion direction of the main portion, the plate springs substantially having the same length as the opening of the body, and wherein the base ends of the plate springs are fixed to a rear-side edge of the main portion.

12. An electronic component as claimed in claim 11, wherein base ends of additional plate springs are fixed to a front-side edge of the main portion.

13. An electronic component as claimed in claim 11, wherein the plate springs cover an opening of the body when the main portion is inserted from the opening into the body.

* * * * *